United States Patent
Tao et al.

(10) Patent No.: US 7,332,253 B1
(45) Date of Patent: Feb. 19, 2008

(54) NEGATIVE-WORKING RADIATION-SENSITIVE COMPOSITIONS AND IMAGEABLE MATERIALS

(75) Inventors: Ting Tao, Fort Collins, CO (US); Scott A. Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/494,235

(22) Filed: Jul. 27, 2006

(51) Int. Cl.
*G03F 7/033* (2006.01)
*G03F 7/038* (2006.01)
*G03F 7/029* (2006.01)
*G03F 7/30* (2006.01)

(52) U.S. Cl. .................. 430/17; 430/287.1; 430/325; 430/910; 430/964; 528/228; 528/292

(58) Field of Classification Search ............. 430/287.1, 430/910, 325, 964, 17; 525/288, 192, 228, 525/292
See application file for complete search history.

(56) References Cited

U.S. PATENT DOCUMENTS 6,306,555 B1 * 10/2001 Schulz et al. ............ 430/270.1
6,858,373 B2    2/2005 Kunita
6,899,994 B2    5/2005 Huang et al.
7,175,949 B1 *  2/2007 Tao et al. ..................... 430/17
2002/0068240 A1 * 6/2002 Teng ........................ 430/280.1
2004/0043325 A1 3/2004 Shibuya et al.
2005/0058934 A1 3/2005 Kawauchi et al.
2005/0064402 A1 3/2005 Goldsworthy et al.

FOREIGN PATENT DOCUMENTS

EP      1 182 033      2/2002
EP      1 389 521      2/2004
EP      1 653 281      5/2006
WO   WO 2005/064402   12/2004

* cited by examiner

*Primary Examiner*—Richard L. Schilling
(74) *Attorney, Agent, or Firm*—J. Lanny Tucker

(57) ABSTRACT

A radiation-sensitive composition and negative-working imageable element includes a polymeric binder comprising pendant allyl ester groups to provide solvent resistance, excellent digital speed (sensitivity) and can be imaged and developed without a preheat step to provide lithographic printing plates. The polymeric binder can be prepared with a precursor polymer having pendant carboxy groups that are converted to allyl ester groups using an allyl-containing halide in the presence of a base in order to avoid gelation.

15 Claims, No Drawings

NEGATIVE-WORKING RADIATION-SENSITIVE COMPOSITIONS AND IMAGEABLE MATERIALS

FIELD OF THE INVENTION

This invention relates to negative-working radiation-sensitive compositions and imageable elements such as negative-working printing lithographic printing plate precursors that have increased solvent resistance and good sensitivity. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, a radically polymerizable component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of from about 700 nm, and thus the radiation-sensitive compositions are required to be sensitive in the near-infrared or infrared region of the electromagnetic spectrum. However, other useful radiation-sensitive compositions are designed for imaging with ultra-violet or visible radiation.

There are two possible ways of using radiation-sensitive compositions for the preparation of printing plates. For negative-working printing plates, exposed regions in the radiation-sensitive compositions are hardened and non-exposed regions are washed off during development. For positive-working printing plates, the exposed regions are dissolved in a developer and the non-exposed regions become an image.

Various negative-working radiation compositions and imageable elements containing reactive polymer binders are known in the art. Some of these compositions and elements are described for example in U.S. Pat. No. 6,569,603 (Furukawa), U.S. Pat. No. 6,309,792 (Hauck et al.), U.S. Pat. No. 6,582,882 (Pappas et al.), U.S. Pat. No. 6,893,797 (Munnelly et al.), and U.S. Pat. No. 6,787,281 (Tao et al.), U.S. Patent Application Publication 2003/0118939 (West et al.), and EP 1,079,276A1 (Lifka et al.), and EP 1,449,650A1 (Goto).

U.S. Pat. No. 6,899,994 (Huang et al.) describes negative-working imageable elements containing polymeric binders that have allyl functional groups. EP 1,182,033A1 (Fujimaki et al.) also describes negative-working elements containing polymers with unsaturated carbon-carbon groups. Moreover, U.S. Pat. No. 4,511,645 (Koike et al.) describes presensitized printing plates comprising a photosensitive imaging layer comprising a polymeric binder that includes both carboxylic groups and pendant carbon-carbon unsaturated groups.

Problem to be Solved

The various radiation sensitive compositions of the art can readily be used to prepare negative-working imageable elements, including those containing polymeric binders with allyl functional groups. However there remains a need to improve chemical (solvent) resistance of the imaged layers in such materials without any loss in digital imaging speed. This problem may be solved using unique polymeric binders having multiple functional groups, such as pendant allyl and cyano groups, but it has been difficult to prepare such polymers without undesirable crosslinking (gelation).

SUMMARY OF THE INVENTION

The present invention provides a radiation-sensitive composition comprising:

a free radically polymerizable component, an initiator composition capable of generating radicals sufficient to initiate polymerization of the radically polymerizable component upon exposure to imaging radiation, a radiation absorbing compound, and a polymeric binder that is represented by the following Structure (I):

wherein A represents recurring units comprising a pendant —C(=O)O—CH$_2$CH=CH$_2$ group, B represents recurring units comprising pendant cyano groups, and C represents recurring units other than those represented by A and B and optionally including recurring units comprising pendant carboxy groups, x is from about 1 to about 70 mol %, y is from about 10 to about 80 mol %, and z is from about 20 to about 90 mol %.

This invention also provides an imageable element comprising a substrate having thereon an imageable layer comprising:

a free radically polymerizable component, an initiator composition capable of generating radicals sufficient to initiate polymerization of the radically polymerizable component upon exposure to imaging radiation, a radiation absorbing compound, and the polymeric binder that is represented by Structure (I) noted above.

This invention also provides a method of making an imaged element comprising:

A) imagewise exposing the negative-working imageable element of this invention to form exposed and non-exposed regions, and B) with or without a preheat step, developing the imagewise exposed element to remove only the non-exposed regions.

Still further, this invention includes a method of making a polymer that is represented by Structure (I), and this method comprises:

A) providing or preparing a precursor polymer that is represented by the following Structure (Ia):

wherein A' represents recurring units comprising a pendant carboxy group, and B, C, x, y, and z are as defined above for Structure (I), and B) reacting the precursor polymer with an allyl-containing halide in the presence of a base under conditions to convert the pendant carboxy groups to pendant —C(=O)O—CH$_2$CH=CH$_2$ groups.

We have found that the use of the particular polymeric binders described herein having pendant allyl groups that the resulting imaged elements have improved solvent resistance without a loss of imaging speed (sensitivity). The resulting imageable elements can be imaged and developed without the conventional pre-heating that many elements require for acceptable developability and printing durability (run-length). We have also found that the polymeric binders can be prepared using a unique synthetic method that avoids the problems of prior art methods. In particular, we found that the allyl groups can be better attached by reacting pendant carboxy groups with an allyl-containing halide. This avoids gelation or crosslinking that occurs with known methods. Further details of the synthetic method are provided below.

DETAILED DESCRIPTION OF THE INVENTION

Definitions

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "radically polymerizable component", "radiation absorbing compound", "polymeric binder", "additional polymeric binder", "initiator", "co-initiator", and similar terms also refer to mixtures of such components. Thus, the use of the articles "a", "an", and "the" are not necessarily meant to refer to only a single component.

Moreover, unless otherwise indicated, percentages refer to percents by dry weight.

The imageable elements of this invention are generally "single-layer" imageable elements by which we mean that the elements contain only one layer that is essential for imaging, but such elements may also include one or more layers under or over (such as a topcoat) the imageable layer for various purposes.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of from about 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove non-exposed regions of the coated and imaged composition. The radiation-sensitive compositions can be used to prepare imageable elements for use as printed circuit boards for integrated circuits (printing circuit boards), paint compositions, molding compositions, color filters, chemically amplified resists, imprint lithography, microelectronic and microoptical devices, and photomask lithography, and preferably printed forms such as lithographic printing plate precursors and imaged printing plates that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and crosslinkable polymers, or various combinations of such compounds.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide (meth)acrylates, polyester (meth)acrylates, polyether (meth)acrylates, free-radical crosslinkable polymers, and unsaturated polyester resins can also be used. In some embodiments, the radically polymerizable component may comprise carboxy groups.

Particularly useful radically polymerizable components include free-radical polymerizable monomers or oligomers that comprise addition polymerizable ethylenically unsaturated groups including multiple acrylate and methacrylate groups and combinations thereof, or free-radical crosslinkable polymers, or combinations of these classes of materials. More particularly useful radically polymerizable compounds include those derived from urea urethane (meth) acrylates or urethane (meth)acrylates having multiple polymerizable groups. For example, a most preferred radically polymerizable component can be prepared by reacting DESMODUR® N100 aliphatic polyisocyanate resin based on hexamethylene diisocyanate (Bayer Corp., Milford, Conn.) with hydroxy acrylate and pentaerythritol triacrylate. Other preferred radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Also useful are urea urethane (meth)acrylates and urethane (meth)acrylates described in U.S. Pat. Nos. 6,582,882 (noted above) and 6,899,994 (noted above), and in U.S. Pat. No. 7,153,632 (Saraiya et al.) that is incorporated by reference.

Numerous other radically polymerizable compounds are known to those skilled in the art and are described in considerable literature including *Photoreactive Polymers The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful radically polymerizable components are also described in EP 1,182,033A1 (noted above), beginning with paragraph [0170].

The radically polymerizable component is present in the radiation-sensitive composition in an amount sufficient to render the composition insoluble in an aqueous developer after exposure to radiation. This is generally from about 10 to about 70 weight % and preferably from about 20 to about 50 weight % based on the dry weight of the radiation-sensitive composition. For example, the weight ratio of radically polymerizable component to the polymeric binder (described below) is generally from about 5:95 to about 95:5, preferably from about 10:90 to about 90:10, and more preferably from about 30:70 to about 70:30.

The radiation-sensitive composition includes an initiator composition that is capable of generating radicals sufficient to initiate polymerization of the radically polymerizable component upon exposure to the imaging radiation. The initiator composition may be responsive, for example, to electromagnetic radiation in the ultraviolet, visible and/or infrared spectral regions, corresponding to the broad spectral range of from about 150 nm to about 1500 nm. UV and visible light sensitivity is generally from about 150 nm to about 700 nm. Preferably, the initiator composition is responsive to infrared or near infrared radiation in the range of from about 600 nm to about 1300 nm, and more preferably to infrared radiation in the range of from about 700 nm to about 1200 nm.

There are numerous compounds known in the literature that can be used in this manner including but not limited to, organic boron salts, s-triazines, benzoyl-substituted compounds, onium salts (such as iodonium, sulfonium, diazonium, and phosphonium salts), trihaloalkyl-substituted compounds, metallocenes (such as titanocenes), hexaarylbisimidazoles (known as "HABI's"), ketoximes, thio compounds, organic peroxides, or a combination of two or more of these classes of compounds. The organic boron salts, s-triazines, iodonium salts, and hexaarylbisimidazoles, or combinations thereof, are preferred.

The initiator compositions most preferably comprise one or more diaryliodonium borate compounds, each of which is represented by the following Structure (II):

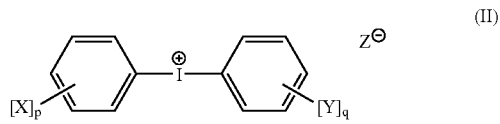

(II)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Preferably, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but preferably they are at the 2- or 4-positions, and more preferably at the 4-position, on either or both phenyl rings.

Despite what type of X and Y groups are present in the iodonium cation, the sum of the carbon atoms in the X and Y substituents is from about 6, and preferably from about 8, to about 40. Thus, in some compounds, one or more X groups can comprise from about 6 carbon atoms, and Y does not exist (q is 0). Alternatively, one or more Y groups can comprise from about 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is from about 6. Still again, there may be a total of from about 6 carbon atoms on both phenyl rings.

In Structure I, p and q are independently 0 or integers of 1 to 5, provided that either p or q is from about 1. Preferably, both p and q are from about 1, and more preferably, each of p and q is 1. Thus, it is understood that the carbon atoms in the phenyl rings that are not substituted by X or Y groups have a hydrogen atom at those ring positions.

$Z^-$ is an organic borate anion represented by the following Structure (III):

(III)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazolyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Preferably, $R_1$, $R_2$, $R_3$, and $R_4$ are independently substituted or unsubstituted alkyl or aryl groups as defined above, and more preferably, at least 3 of $R_1$, $R_2$, $R_3$, and $R_4$ are the same or different substituted or unsubstituted aryl groups (such as substituted or unsubstituted phenyl groups). Most preferably, all of $R_1$, $R_2$, $R_3$, and $R_4$ are the same or different substituted or unsubstituted aryl groups and most preferably, all of the groups are the same substituted or unsubstituted phenyl group. Preferably, $Z^-$ is a tetraphenyl borate wherein the phenyl groups are substituted or unsubstituted (and most preferably, all are unsubstituted).

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis (4-fluorophenyl)borate, bis(dodecylphenyl)iodonium tetrakis(pentafluorophenyl)borate, and bis(4-t-butylphenyl)iodonium tetrakis(1-imidazolyl)borate. Preferred compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry,* 37, 4241-4254 (1999).

The initiator composition including one or more initiator compounds is generally present in the radiation-sensitive composition in an amount of from about 0.5% to about 30%, based on the total solids of the radiation-sensitive composition or the dry weight of the coated imageable layer. Preferably, the initiator composition is present in an amount of from about 2% to about 20 weight %. In the preferred embodiments, one or more diaryliodonium borate compounds generally comprise from about 10 to about 100% of the initiator composition. In the coated imageable layers of the imageable elements, the preferred diaryliodonium borate compounds are generally present in an amount of from about 0.01 g/m² and preferably from about 0.03 to about 0.3 g/m².

The polymeric binders used in the radiation-sensitive composition are unique and uniquely prepared. These polymeric binders are represented by the following Structure (I):

wherein A represents recurring units comprising a pendant —C(=O)O—CH₂CH=CH₂ group, B represents recurring units comprising pendant cyano groups, and C represents recurring units other than those represented by A and B and optionally including recurring units having pendant carboxy groups (for example, recurring units in which the carboxy groups are not converted to —C(=O)O—CH₂CH=CH₂ groups as described below).

Monomers from which the C recurring units can be derived are numerous and include but are not limited to those classes of monomers represented by the following Structures (C₁), (C₂), (C₃), (C₄), and (C₅). The polymers can have recurring units derived from the same or different class of monomers.

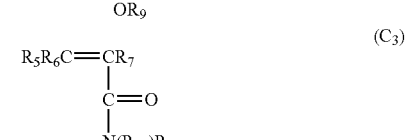

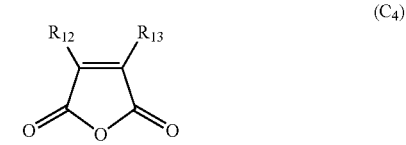

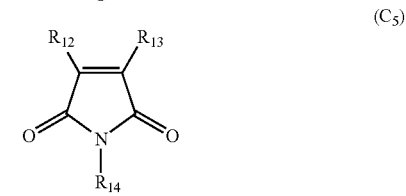

In these Structures (C₁), (C₂), (C₃), (C₄), and (C₅), R₅ and R₆ are independently hydrogen, or substituted or unsubstituted alkyl, alkenyl, cycloalkyl, phenyl, halo, cyano, acyl, acyloxy, or alkoxy groups, with the carbon-containing groups having up to 6 carbon atoms. Alternatively, $R_5$ and $R_6$ can together provide the atoms necessary to form a carbocyclic or heterocyclic ring having up to 8 atoms in the ring. For example, $R_5$ and $R_6$ together can form a —NHC(=O)CH$_2$CH$_2$CH$_2$—, —NHC(=O)CH$_2$CH$_2$—, CH$_2$C(=O)OC(=O)—, —(CH$_2$)$_2$C(=O)OC(=O)—, —CH$_2$C(=O)OC(=O)CH$_2$— group attached to the unsaturated carbon atom. Preferably, $R_5$ and $R_6$ are independently hydrogen or alkyl or halo groups, and more preferably, they are independently hydrogen, methyl, or chloro groups, with hydrogen being most preferred for both radicals.

$R_7$ is hydrogen or a substituted or unsubstituted alkyl, aryl, cycloalkyl, halo, or cyano group with the carbon-containing groups having up to 6 carbon atoms. Preferably, $R_7$ is hydrogen or methyl.

$R_8$ is hydrogen or a substituted or unsubstituted alkyl having up to 6 carbon atoms, N-carbazole, phenyl, halo, or cyano group. Preferably, $R_8$ is a phenyl, N-carbazole, 4-carboxyphenyl, or cyano group.

$R_9$ is hydrogen or a substituted or unsubstituted alkyl group having up to 20 carbon atoms, alkenyl group having 2 to 20 carbon atoms, cycloalkyl or cycloalkenyl group having 5 to 10 carbon atoms in the ring, phenyl group, or alkoxyalkylene group having 2 to 20 carbon atoms. Preferably, $R_9$ is hydrogen or a methyl, ethyl, benzyl, or methoxymethyl group.

$R_{10}$ and $R_{11}$ are independently hydrogen or a substituted or unsubstituted alkyl groups having up to 12 carbon atoms, alkenyl group having 2 to 12 carbon atoms, cycloalkyl groups having from about 5 carbon atoms in the ring, cycloalkenyl groups having from about 5 carbon atoms in the ring, phenyl groups, or alkoxyalkylene groups having 2 to 12 carbon atoms. Preferably, $R_{10}$ and $R_{11}$ are independently hydrogen or methyl, benzyl, or methoxymethyl groups.

$R_{12}$ and $R_{13}$ are independently hydrogen, or substituted or unsubstituted alkyl groups having up to 7 carbon atoms, alkenyl groups having 2 to 6 carbon atoms, phenyl groups, phenyl groups, halo, cyano, acyl groups having up to 6 carbon atoms, acyloxy groups having up to 6 carbon atoms, or alkoxy groups having up to 6 carbon atoms. Preferably, $R_{12}$ and $R_{13}$ are independently hydrogen or methyl or phenyl groups.

$R_{14}$ is hydrogen or a substituted or unsubstituted alkyl group having up to 7 carbon atoms (including benzyl), phenyl group, or hydroxy group. Preferably, $R_{14}$ is hydrogen or a phenyl or 4-carboxyphenyl groups.

In Structure (I), x is from about 1 to about 70 mol %, y is from about 10 to about 80 mol %, and z is from about 20 to about 90 mol %. Preferably, x is from about 5 to about 50 mol %, y is from about 10 to about 60 mol %, and z is from about 30 to about 80 mol %, and more preferably, x is from about 5 to about 35 mol %, y is from about 15 to about 50 mol %, and z is from about 30 to about 65 mol %.

Preferably, B represents recurring units derived from (meth)acrylonitrile, and C represents recurring units derived from one or more (meth)acrylic acid esters, (meth)acrylamides, vinyl carbazole, styrene and styrenic derivatives thereof, N-substituted maleimides, (meth)acrylic acid, maleic anhydride, vinyl acetate, vinyl ketones (such as vinyl methyl ketone), vinyl pyridines, N-vinyl pyrrolidones, 1-vinylimidazole, and vinyl polyalkylsilanes (such as vinyl trimethylsilane). Most preferably, B represents recurring units derived from acrylonitrile, and C is derived from one or more of methacrylic acid, acrylic acid, vinyl carbazole, methyl methacrylate, 2-hydroxyethyl methacrylate, styrene, and N-phenylmaleimide.

Some particularly useful polymeric binders represented by Structure (I) are identified below as Polymer A, B, and C in the Examples.

The polymeric binders represented by Structure (I) are generally present in the radiation-sensitive composition (and imageable layer) in an amount of from about 10 to about 70 weight %, based on the total composition or layer solids. Preferably, the amount is from about 20 to about 50 weight %.

The polymeric binders of Structure (I) generally have a molecular weight of from about 2,000 to about 1,000,000 and preferably from about 10,000 to about 200,000. The acid value (mg KOH/g) of the polymeric binder is generally from about 20 to about 400 as determined using known methods.

The polymeric binders can also be defined as having a solubility of less than 50 mg (preferably less than 25 mg) in 1 gram of an 80 weight % solution of 2-butoxyethanol in water, at 25° C. In addition, the useful polymeric binders exhibit less than 60% loss in optical density (preferably less than 40% loss in optical density) after treatment for 10 minutes in an 80 weight % solution of 2-butoxyethanol in water. Optical density can be measured as demonstrated in Example 1 below using a conventional densitometer.

These unique polymeric binders are prepared using a unique synthetic method that avoids the problems of gelation encountered with prior art methods. More particularly, the polymer that is represented by Structure (I) can be prepared by:

A) providing or preparing a precursor polymer that is represented by the following Structure (Ia):

wherein A' represents recurring units comprising a pendant carboxy group, and B, C, x, y, and z are as defined above, and B) reacting the precursor polymer with an allyl-containing halide in the presence of a base under conditions to convert the pendant carboxy groups to pendant —C(=O)O—CH$_2$CH=CH$_2$ groups.

As one skilled in the art would understand from this teaching, not all of the recurring units represented by A' may be converted to the pendant —C(=O)O—CH$_2$CH=CH$_2$ groups. Those unconverted A' recurring units would really be included in the polymeric binders as C recurring units having pendant carboxy groups.

Useful bases can be organic or inorganic and include but are not limited to, hydroxides (such as lithium hydroxide, sodium hydroxide, potassium hydroxide, beryllium hydroxide, calcium hydroxide, ammonium hydroxide, and barium hydroxide), carbonates (such as sodium carbonate, sodium bicarbonate, potassium carbonate, and potassium bicarbonate), metallic alkoxides (such as sodium methoxide, sodium ethoxide, and potassium t-butoxide), and organic amines (such as triethylamine, pyridine, and 1,8-diazabicyclo[5,4,0]-undec-7-ene. Preferred bases are the hydroxides, trialkylamine, pyridine, and 1,8-diazabicyclo[5,4,0]-undec-7-ene.

The allyl-containing halide used in the reaction can be any organic halide having an allyl reactive group, and include for example, allyl chloride, allyl bromide, allyl iodide, allyl alcohol, and allyl acetate. The preferred allyl-containing halide is allyl chloride or allyl bromide.

The reaction of the precursor polymer with the allyl halide is generally carried out for from about 1 to about 48 hours (preferably for from about 1 to about 5 hours) at a temperature of from about 20 to about 150° C. (preferably at from about 20 to about 100° C.), or until at least 25 mol % of the carboxy groups in the A' recurring units have been converted to the allyl-containing groups defined above for the A recurring units. Preferably, at least 50 mol % of the carboxy groups are so converted.

The radiation-sensitive composition can additionally include known polymeric binders known in the art for use in negative-working radiation-sensitive compositions. These additional polymeric binders generally have a molecular weight of from about 2,000 to about 1,000,000 and preferably from about 10,000 to about 200,000. The acid value (mg KOH/g) of the polymeric binder is generally from about 20 to about 400 as determined using known methods. However, when a mixture of polymeric binders is used, at least 25 weight % (preferably at least 40 weight %) of the total polymeric binders is composed of those represented by Structure (I) defined above.

Examples of additional polymeric binders include but are not limited to, (meth)acrylic acid ester resins, polyvinyl acetals, phenolic resin, polymers derived from styrene, N-substituted cyclic imides or maleic anhydrides, such as those described in EP 1,182,033 (noted above) and U.S. Pat. Nos. 6,309,792 (noted above), 6,352,812 (Shimazu et al.), 6,569,603 (noted above), and 6,893,797 (noted above). Also useful are the vinyl carbazole polymers having pendant N-carbazole moieties as described in U.S. Pat. No. 7,175,949 (Tao et al.) and polymers having pendant reactive vinyl groups as described in copending and commonly assigned U.S. Ser. No. 11/349,376 (filed Feb. 7, 2006 by Tao et al), both of which applications are incorporated herein by reference.

Other useful additional polymeric binders are dispersible, developable, or soluble in water or water/solvent mixtures such as fountain solutions. Such polymeric binders include polymeric emulsions, dispersions, or graft polymers having pendant poly(alkyleneoxide) side chains that can render the imageable elements as "on-press" developable. Such polymeric binders are described for example in U.S. Pat. Nos. 6,582,882 and 6,899,994 (both noted above). In some instances, these additional polymeric binders are present in the imageable layer as discrete particles.

Other useful additional polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene oxide) segments.

These additional polymeric binders comprise poly(alkylene oxide) segments and preferably poly(ethylene oxide) segments. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly (propylene oxide) segments are preferred and poly(ethylene oxide) segments are most preferred.

In some embodiments, the additional polymeric binders contain only recurring units comprising poly(alkylene oxide) segments, but in other embodiments, the additional polymeric binders comprise recurring units comprising the poly(alkylene oxide) segments as well as recurring units having pendant cyano groups attached directly to the hydrophobic backbone. By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

By way of example, such additional polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such additional polymeric binders is from about 0.5 to about 60 weight %, preferably from about 2 to about 50 weight %, more preferably from about 5 to about 40 weight %, and most preferably from about 5 to about 20 weight %. The amount of (alkylene oxide) segments in the block copolymers is generally from about 5 to about 60 weight %, preferably from about 10 to about 50 weight %, and more preferably from about 10 to about 30 weight %. It is also possible that the polymeric binders having poly(alkylene oxide) side chains are present in the form of discrete particles.

The additional polymeric binders described above can be present in an amount of from about 10 to about 75%, and preferably from about 20 to about 50%, based on the total solids content of the radiation-sensitive composition, or the dry weight of the imageable layer prepared therefrom.

In some embodiments, it may be useful to include "secondary" additional polymeric binders in combination with the polymeric binders described above. Such additional secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions. The additional secondary polymeric binder may be present in the radiation-sensitive composition in an amount of from about 5 to about 40 weight % based on the total solids content of the composition, or the dry coated weight of the imageable layer.

The radiation-sensitive compositions also include a radiation absorbing compound (sometimes called a "sensitizer") that is sensitive to radiation at a desired wavelength. These compounds absorb the radiation and facilitate polymerization during imaging. The radiation absorbing compounds can be sensitive to radiation having a wavelength of from about 150 to about 1400 nm. The compounds sensitive to UV and visible radiation generally have a $\lambda_{max}$ of from about 150 to about 600 nm, and preferably of from about 200 to about 550 nm.

Preferably, the radiation absorbing compounds are sensitive to infrared and near-infrared radiation, that is, a wavelength of from about 600 to about 1400 nm and preferably of from about 700 to about 1200 nm. Such radiation absorbing compounds include carbon blacks and other IR-absorbing pigments and various IR-sensitive dyes ("IR dyes"), which are preferred.

Examples of suitable IR dyes include but are not limited to, azo dyes, squarilium dyes, croconate dyes, triarylamine dyes, thiazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(cbalcogenopyrylo) polymethine dyes, oxyindolizine dyes, pyrylium dyes, pyrazoline azo dyes, oxazine dyes, naphtboquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,569,603 (noted above), and 6,787,281 (noted above), and EP Publication 1,182,033A1 (noted above).

A general description of one class of suitable cyanine dyes is shown by the formula in paragraph [0026] of WO 2004/101280. In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount generally of from about % to about 30% and preferably from about 2 to about 15%, based on total solids in the composition that also corresponds to the total dry weight of the imageable layer. Alternatively, the amount can be defined by an absorbance in the range of from about 0.05 to about 3, and preferably of from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition can also include a poly(alkylene glycol) or an ether or ester thereof that has a molecular weight of from about 200 to about 4000 (preferably from about 500 to about 2000). This additive can be present in an amount of from about 2 to about 50 weight % (preferably from about 5 to about 30%) based on the total solids content of the composition, or the total dry weight of the imageable layer. Particularly useful additives of this type include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc.

The radiation-sensitive composition can also include a poly(vinyl alcohol), a poly(vinyl pyrrolidone), poly(vinyl imidazole), or polyester in an amount of up to 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate to form an imageable layer. This substrate can be treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is generally considered the "top" or outermost layer. These interlayers, however, are not considered "imageable layers". While there is usually no need to apply what is conventionally known as an overcoat (such as an oxygen impermeable topcoat) to the imageable layer(s) as described in WO 99/06890 (Pappas et al.), it can be used if desired. Such overcoat layers can comprise one or more water-soluble polymers such as poly (vinyl alcohol), poly(vinyl pyrrolidone), and poly(vinyl imidazole) and generally are present at a dry coating weight of from about 0.1 to about 4 g/m$^2$.

The substrate generally has a hydrophilic surface, or from about a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is electrochemically anodized using phosphoric acid or sulfuric acid and conventional procedures.

An interlayer may be formed by treatment of the aluminum support with, for example, a silicate, dextrine, calcium zirconium fluoride, hexafluorosilicic acid, phosphate solution containing a fluoride such as sodium fluoride (PF), poly(vinyl phosphonic acid) (PVPA), vinyl phosphonic acid copolymer, poly(acrylic acid), or acrylic acid copolymer. Preferably, the aluminum support is mechanically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such manufacturing methods is mixing the radically polymerizable component, initiator composition, radiation absorbing compound, polymeric binder(s), and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imageable layer formulations are described in the Examples below. After proper drying, the coating weight of the imageable layer is generally from about 0.1 to about 5 $g/m^2$, preferably from about 0.5 to about 3.5 $g/m^2$, and more preferably from about 0.5 to about 1.5 $g/m^2$.

Layers can also be present under the imageable layer to enhance developability or to act as a thermal insulating layer. The underlying layer should be soluble or from about dispersible in the developer and preferably have a relatively low thermal conductivity coefficient.

The imageable elements have any useful form including but not limited to, printing plate precursors, printing cylinders, printing sleeves and printing tapes (including flexible printing webs). Preferably, the imageable members are printing plate precursors that can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable source of radiation such as UV, visible light, near-infrared, or infrared radiation, depending upon the radiation absorbing compound present in the radiation-sensitive composition, at a wavelength of from about 150 nm to about 1500 nm. Preferably, imaging is carried out using an infrared laser at a wavelength of from about 700 nm to about 1200 nm. The laser used to expose the imageable element is preferably a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® imagesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging can be carried out generally at an imaging energy of from about 20 $mJ/cm^2$ to about 500 $mJ/cm^2$, preferably from about 50 and up to 300 $mJ/cm^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without the need for a pre-heat step after imaging, the imaged elements can be developed "off-press using conventional processing and a conventional developer.

For off-press development, the developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the alkaline developer is preferably from about 7 to about 14. The imaged elements are generally developed using conventional processing conditions. Both aqueous alkaline developers and solvent-based developers can be used with the latter type of developers being preferred.

Useful alkaline aqueous developers include 3000 Developer, 9000 Developer, GOLDSTAR Developer, GREENSTAR Developer, ThermalPro Developer, PROTHERM Developer, MX 1813 Developer, and MX 1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic developers can be neutral, alkaline, or slightly acidic in pH, and preferably, they are alkaline in pH.

Representative solvent-based developers include ND-1 Developer, Developer 980, 2 in 1 Developer, and 956 Developer (all available from Eastman Kodak Company).

Generally, the developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following this off-press development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the imaged element.

Printing can be carried out by applying a lithographic ink and fountain solution to the printing surface of the imaged and developed element. The fountain solution is taken up by the non-exposed regions, that is, the surface of the hydrophilic substrate revealed by the imaging and development steps, and ink is taken up by the imaged (exposed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention may be developable "on-press". This type of development avoids the use of the developing solutions described above. The imaged element is directed mounted onto the press wherein the non-exposed regions in the imageable layer are removed by a suitable fountain solution, lithographic ink, or both, during the initial impressions in printing. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.). Alternatively, the imageable element can be both imaged and developed on-press.

The following examples are provided to illustrate the practice of the invention but are by no means intended to limit the invention in any manner.

EXAMPLES

The components and materials used in the examples and analytical methods used in evaluation were as follows. Unless otherwise indicated, the components can be obtained from Aldrich Chemical Company (Milwaukee, Wis.):

BLO represents γ-butyrolactone.

Byk® 307 is a polyethoxylated dimethyl polysiloxane copolymer that was obtained from Byk Chemie (Wallingford, Conn.) in a 25 wt. % xylene/methoxypropyl acetate solution.

D11 is a coloring dye having the following structure and available from PCAS (Longjumeau, France).

D11

DMAC represents N,N'-dimethylacetamide.

Initiator A is bis(4-t-butylphenyl) iodonium tetraphenylborate.

Irganox® 1035 was thiodiethylene bis(3,5-di-t-butyl-4-hydroxyhydrocinnamate) and was obtained from Ciba Specialty Chemicals Company.

IRT is an IR Dye that was obtained from Showa Denko (Japan).

MEK represents methyl ethyl ketone.

Oligomer A is a urethane acrylate that was prepared by reacting Desmodur N 100 with hydroxyethyl acrylate and pentaerythritol triacrylate (80% by weight in MEK).

PEGDA is a polyethylene glycol diacrylate (MW=700).

PGME represents 1-methoxy-2-propanol and it is also known as Dowanol PM.

Phosmer PE is an ethylene glycol methacrylate phosphate with 4-5 ethylene glycol units that was obtained from Uni-Chemical Co., Ltd. (Japan).

Pigment A (951) is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Polymer 1 is a copolymer derived from allyl methacrylate (80 weight %) and methyl methacrylate (20 weight %) (10% solution in diethylketone) using standard addition polymerization conditions.

SR399 is dipentaerythritol pentaacrylate that was obtained from Sartomer Company, Inc. (Exton, Pa.).

956 Developer is a solvent based (phenoxyethanol) alkaline negative developer (Eastman Kodak Company).

Synthetic Preparation of Polymer A (Invention)

AIBN [2,2'-azobis(iso-butyronitrile), Vazo-64, 1.6 g], methyl methacrylate (20 g), acrylonitrile (24 g), N-vinyl carbazole (20 g, from Polymer Dajac), methacrylic acid (16 g), and DMAC (320 g) were placed in a 1000-ml 3-necked flask, equipped with magnetic stirring, temperature controller, and $N_2$ inlet. The reaction mixture was heated to 60° C. and stirred under $N_2$ protection overnight (about 16 hours). The % N.V. was measured with about 20%.

To above reaction mixture (after nitrogen-protection was removed), potassium hydroxide (5.2 g) in water (40 g) was slowly added and a viscous liquid was formed. After stirring the mixture for 10 minutes, allyl bromide (13.3 g) was added and the mixture was stirred at 55° C. for 3 hours. Concentrated (36%) hydrochloric acid (12 g) in DMAC (40 g) was added to the flask and the reaction mixture was stirred for another 3 hours. The resulting reaction mixture was then slowly dropped into a mixture of 12 liters of ice water with 20 g of concentrated hydrochloric acid while stirring. The resulting precipitate was filtered and washed with 2000 ml of propanol, followed by washing with 2000 ml of water. A fine white powder was obtained after filtration. The powder was dried at room temperature overnight and then at 50° C. for 3 hours to obtain 80 g of polymer solid.

Synthetic Preparation of Polymer B (Invention)

AIBN (1.6 g), methyl methacrylate (10 g), acrylonitrile (24 g), vinyl carbazole (20 g), methacrylic acid (26 g), and DMAC (320 g) were placed in a 1000-ml 3-necked flask, equipped with magnetic stirring, temperature controller and $N_2$ inlet. The reaction mixture was heated to 60° C. and stirred under $N_2$ protection overnight (about 16 hours). The % of non-volatiles was measured as 20%. The nitrogen protection was removed, and potassium hydroxide (14.3 g) in water (80 g) was added. A viscous liquid was formed. After stirring the mixture for 10 minutes, allyl bromide (31 g) was added and the mixture was stirred at 55° C. for 3 hours. Concentrated (36%) hydrochloric acid (26 g) in DMAC (40 g) was added to the flask and the mixture was stirred for another 3 hours. The reaction mixture was filtered to remove inorganic salt formed and the filtrate was then slowly dropped to a mixture of 12 liters of water with concentrated hydrochloric acid (20 g) while stirring. The precipitate was filtered and washed with 2000 ml of propanol, followed by another 2000 ml of water. A fine white powder was obtained after filtration. The powder was dried at 40° C. for 10 hours to obtain 63 g of polymer solid.

Synthetic Preparation of Polymer C (Invention)

AIBN (1.6 g), methyl methacrylate (16 g), acrylonitrile (28 g), vinyl carbazole (16 g), methacrylic acid (20 g), and DMAC (320 g) were placed in a 1000-ml 3-necked flask, equipped with magnetic stirring, temperature controller and $N_2$ inlet. The reaction mixture was heated to 60° C. and stirred under $N_2$ protection overnight (about 16 hours). The % of non-volatiles was measured as 20%. The nitrogen protection was removed, and potassium hydroxide (7.8 g) in water (40 g) was added. A viscous liquid was formed. After stirring the mixture for 10 minutes, allyl bromide (16.9 g) was added and the mixture was stirred at 55° C. for 3 hours. Concentrated (36%) hydrochloric acid (14.5 g) in DMAC (40 g) was added to the flask and the mixture was stirred for another 3 hours. The reaction mixture was filtered to remove inorganic salt formed and the filtrate was then slowly dropped to a mixture of 12 liters of water with concentrated hydrochloric acid (20 g) while stirring. The precipitate was filtered and washed with 2000 ml of propanol, followed by another 2000 ml of water. A fine white powder was obtained after filtration. The powder was dried at 40° C. for 10 hours to obtain 65 g of polymer solid.

Synthetic Preparation of Polymer D (Comparative)

AIBN (0.4 g), methyl methacrylate (5 g), acrylonitrile (6 g), vinyl carbazole (5 g), allyl methacrylate (2 g), methacrylic acid (2 g), and DMAC (80 g) were placed in a 250-ml 3-necked flask, equipped with magnetic stirring, temperature controller and $N_2$ inlet. The mixture was heated to 60° C. and stirred under $N_2$ protection. After 6 hours of reaction, the reaction mixture gelled.

Synthetic Preparation of Polymer E (Comparative)

AIBN (0.4 g), methyl methacrylate (2.5 g), acrylonitrile (6 g), vinyl carbazole (5 g), allyl methacrylate (5.5 g), methacrylic acid (1 g), and DMAC (80 g) were placed in a 250-ml 3-necked flask, equipped with magnetic stirring, temperature controller and $N_2$ inlet. The mixture was heated to 60° C. and stirred under $N_2$ protection. After 2.5 hours of reaction, the reaction mixture gelled.

Synthetic Preparation of Polymer F (Comparative)

AIBN (0.4 g), methyl methacrylate (4 g), acrylonitrile (7 g), vinyl carbazole (4 g), allyl methacrylate (3 g), methacrylic acid (2 g), and DMAC (80 g) were placed in a 250-ml 3-necked flask, equipped with magnetic stirring, temperature controller and $N_2$ inlet. The mixture was heated to 60° C. and stirred under $N_2$ protection. After 4 hours of reaction, the reaction mixture gelled.

Example 1

Solvent Resistance Test for Various Polymer Binders

This example demonstrates the chemical (solvent) resistance of the polymeric binders prepared according to the present invention compared to polymeric binders outside of the present invention.

Method 1

Polymer A, B, C and Polymer 1 identified above (1 g of each) were individually stirred into 20 g of an 80 weight % solution of 2-butoxyethanol in water for 16 hours at 25° C. The resulting mixtures were filtered and the collected solids were washed with water and dried at 40° C. for 8 hours. The recovered polymer solids were weighed and found to be 0.88 g, 0.79 g, 0.82 g, and 0 g for Polymers A, B, C, and Polymer 1, respectively. Thus, the solubility (mg/g of 80 weight % 2-butoxyethanol solution) of the polymers was determined as described in the following TABLE I:

TABLE I

| Polymer A | Polymer B | Polymer C | Polymer 1 |
|---|---|---|---|
| 6.0 | 10.5 | 9.0 | >50.0 |

Method 2

Polymers A, B, C and Polymer 1 identified above were individually dissolved in a solvent mixture of PGME (65 weight %) and MEK (35 weight %) to achieved an 8 weight % solution for each of Polymers A, B, and C and a 4.6 weight % solution for Polymer 1. D11 dye (0.5 weight %) was added to each solution for visual purpose. These non-imageable solutions were individually coated onto an electrochemically-grained and sulfuric acid anodized aluminum substrate (that had been post-treated with either PVPA) by using a wire-wound rod and then dried for approximately 2 minutes residence time in a Ranar conveyor oven set at about 120° C. An 80 weight % 2-butoxy-ethanol solution in water was dropped onto each coated polymer film in 2-minute intervals for up to 12 minutes. After rinsing off the drops with water, the optical densities in the areas contacted by the solvent were measured using a commercial Densitometer D196 (Gretag-Macbeth AG, Regensdorf, Switzerland) with a cyan filter.

The percentage loss of optical density after 12 minutes contact with the solvent mixture were as follows: for the coated layer of Polymer 1, 99%, for the coated layer of Polymer A, 5.8%, for the coated layer of Polymer B, 23%, and for the coated layer of Polymer C, 15%. It is evident that Polymers A, B, and C exhibited significantly improved resistance to the solvent mixture compared to Polymer 1.

Example 2

Single-layer Negative-Working Imageable Elements & Plates

An imageable layer coating formulation was prepared by dissolving Polymer A (1.05 g), Oligomer A (0.73 g), SR-399 (0.56 g), Initiator A (0.19 g), IR Dye 1 (0.083 g), Irganox® 1035 (0.44 g, 5% in MEK), Pigment 951 (0.30 g), PEGDA (0.24 g), Phosmer PE (0.033 g), and a 10% Byk® 307 solution (0.28 g) in PGME (30.2 g) and MEK (15.9 g).

This formulation was coated onto an electrochemically-grained and sulfuric acid anodized aluminum substrate that had been post-treated with sodium hexafluorophosphate (PF) to provide a dry coating weight of about 1.3 g/m² when dried at 170° F. (77° C.) for about 2 minutes on a rotating drum. Samples of the resulting imageable element were then imagewise exposed to a 830 nm IR laser at 4.5 Watts power and varying drum speed (250-60 rpm) on a CREO® Trendsetter 3244x image setter, and was developed in an NE 34 processor (Eastman Kodak Company) containing 956 Developer at 25° C. The minimum energy to achieve a stable solid density and clean background was about 85 mJ/cm².

Other samples of the imageable element were incubated at either 48° C. or 38° C./80% humidity for 5 days and then imaged and developed in a similar fashion. They showed similar digital speed and resulting clean backgrounds. Another sample of the imageable element was exposed at 120 mJ/cm² and then mounted on a Miehle sheet-fed press using a wear ink containing 1.5% calcium carbonate to produce from about 15,000 good impressions.

Example 3

Negative-Working Imageable Element with Topcoat

An imageable element was prepared according to Example 2. The imageable layer was overcoated with a solution containing 9.7% Airvol 203 (162.8 g, polyvinyl alcohol) in water, 20% polyvinyl imidazole (13.9 g) in water, 2-propanol (11.8 g), and water (111.4 g). After applying the overcoat formulation in a similar manner as the imageable layer formulation, the resulting imageable element was dried at 170° F. (77° C.) for about 1 minute on a rotating drum to yield a dry coating weight of overcoat of about 0.5 g/m².

The imageable element was then exposed to an 830 nm IR laser at 2.5 W power and varying drum speed (250-60 RPM) on a CREO® Trendsetter 3244x imagesetter and was developed in an NE 34 processor containing with 956 Developer at 25° C. The minimum energy needed to achieve a stable solid density and clean background was about 50 mJ/cm². Samples of the same element were incubated 48° C. for 5 days, imaged, and developed, showing similar digital speed and clean background. Another sample of the imageable element was exposed at 80 mJ/cm² and then mounted on a Miehle sheet-fed press using a wear ink containing 1.5% calcium carbonate to produce from about 20,000 good impressions.

Example 4

Imageable Element Containing Polymer B

An imageable layer coating formulation was prepared by dissolving Polymer B (1.05 g), Oligomer A (0.73 g), SR-399 (0.56 g), Initiator A (0.19 g), IR Dye 1 (0.083 g), Irganox® 1035 (0.44 g, 5% in MEK), Pigment 951 (0.30 g), PEGDA (0.24 g), Phosmer PE (0.033 g), and a 10% Byk® 307 solution (0.28 g) in PGME (30.2 g) and MEK (15.9 g).

This formulation was coated onto an electrochemically-grained and sulfuric acid anodized aluminum substrate that had been post-treated with sodium hexafluorophosphate (PF) to provide a dry coating weight of about 1.3 g/m² when dried at 170° F. (77° C.) for about 2 minutes on a rotating drum. Samples of the resulting imageable element were then imagewise exposed to a 830 nm IR laser at 4.5 Watts power and varying drum speed (250-60 rpm) on a CREO® Trendsetter 3244x imagesetter, and was developed in an NE 34 processor containing 956 Developer at 25° C. The minimum energy to achieve a stable solid density and clean background was about 65 mJ/cm².

Other samples of the imageable element were incubated at either 48° C. or 38° C./80% humidity for 5 days and then imaged and developed in a similar fashion. They showed similar digital speed and resulting clean backgrounds. Another sample of the imageable element was exposed at 120 mJ/cm² and then mounted on a Miehle sheet-fed press using a wear ink containing 1.5% calcium carbonate to produce from about 15,000 good impressions.

The same imageable layer formulation was also applied to an electrochemically grained and sulfuric acid anodized aluminum substrate that had been post-treated with poly (vinyl phosphoric acid) (PVPA). The resulting imageable element was exposed in the same method described above. The minimum energy to achieve a stable solid density and clean background was also about 120 mJ/cm². Similarly incubated elements showed similar digital speed and clean background. Still another imageable element having the PVPA-treated substrate was exposed at 160 mJ/cm² and was then mounted on a Miehle sheet-fed press using a wear ink containing 1.5% calcium carbonate to produce from about 20,000 good impressions.

Example 5

Imageable Element with PVA Overcoat

The imageable elements described in Example 4 were prepared with an overcoat layer as described above in Example 3. The elements were then imagewise exposed and developed as described in Example 4. For the element having the PF post-treated substrate, the background showed slight staining after developing. For the element containing the PVPA post-treated substrate, the minimum energy to achieve a stable solid density and clean background was about 60 mJ/cm². Other samples of the imageable elements were incubated at either 48° C. or 38° C./80% humidity for 5 days and then imaged and developed in a similar fashion. They showed similar digital speed and resulting clean backgrounds. Other samples of the imageable element were exposed at 120 mJ/cm² and then mounted on a Miehle sheet-fed press using a wear ink containing 1.5% calcium carbonate to produce from about 20,000 good impressions.

Example 6

Imageable Element Containing Polymer C

Imageable elements were prepared, imaged, and developed as described in Example 2 above except that Polymer C (1.05 g) was used instead of Polymer A. The minimum energy needed to achieve a stable solid density and clean background was about 100 mJ/cm².

Other samples of the imageable element were incubated at either 48° C. or 38° C./80% humidity for 5 days and then imaged and developed in a similar fashion. They showed similar digital speed and resulting clean backgrounds.

The invention has been described in detail with particular reference to certain preferred embodiments thereof, but it will be understood that variations and modifications can be effected within the spirit and scope of the invention.

The invention claimed is:

1. An imageable element comprising a substrate having thereon an imageable layer comprising:
   a free radically polymerizable component,
   an initiator composition capable of generating radicals sufficient to initiate polymerization of said radically polymerizable component upon exposure to imaging radiation,
   a radiation absorbing compound, and
   a polymeric binder that is represented by the following Structure (I):

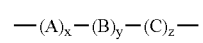

(I)

wherein A represents recurring units comprising a pendant —C(=O)O—CH$_2$CH=CH$_2$ group,
   B represents recurring units comprising pendant cyano groups,
   C represents recurring units selected from each of: 1) recurring units having pendant carboxy groups, 2) recurring units derived from vinyl carbazole, and 3) recurring units derived from methyl methacrylate,
   x is from about 1 to about 70 mol %, y is from about 10 to about 80 mol %, and z is from about 20 to about 90 mol %.

2. The element of claim 1 wherein B represents recurring units derived from (meth)acrylonitrile, x is from about 5 to about 50 mol %, y is from about 10 to about 60 mol %, and z is from about 30 to about 80 mol %.

3. The element of claim 1 wherein said polymeric binder represents from about 10 to about 70 weight %, based on the total dry weight of said imageable layer.

4. The element of claim 1 wherein said polymeric binder has a solubility of less than 50 mg in 1 gram of an 80 weight % solution of 2-butoxyethanol in water, at 25° C.

5. The element of claim 1 wherein said initiator composition comprises an iodonium borate comprising a diaryliodonium borate compound represented by the following Structure (II):

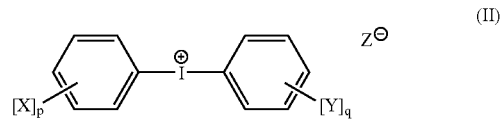

(II)

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is from about 1, and Z$^-$ is an organic anion represented by the following Structure (III):

(III)

wherein R$_1$, R$_2$, R$_3$, and R$_4$ are independently alkyl, aryl, alkenyl, alkynyl, cycloalkyl, or heterocyclyl groups, or two or more of R$_1$, R$_2$, R$_3$, and R$_4$ can be joined together to form a heterocyclic ring with the boron atom.

6. The element of claim 5 wherein X and Y are independently alkyl, alkyloxy, or cycloalkyl groups, both p and q is from about 1, and R$_1$, R$_2$, R$_3$, and R$_4$ are independently alkyl or aryl groups.

7. The element of claim 5 wherein X and Y are independently alkyl groups, from about 3 of R$_1$, R$_2$, R$_3$, and R$_4$ are independently aryl groups, and Z$^-$ is a tetraphenylborate.

8. The element of claim 5 wherein said iodonium borate is present in an amount of from about 1 weight %.

9. The element of claim 1 wherein said free radically polymerizable component comprises an ethylenically unsaturated free-radical polymerizable monomer or oligomer, or a free-radical crosslinkable polymer.

10. The element of claim 1 wherein said radiation absorbing compound is an infrared radiation absorbing compound.

11. The element of claim 1 wherein said polymeric binder represents from about 10 to about 80 weight %, based on the total imageable layer weight.

12. The element of claim 5 wherein X and Y are independently alkyl groups, from about 3 of $R_1$, $R_2$, $R_3$, and $R_4$ are independently aryl groups, and $Z^-$ is a tetraphenylborate, and said iodonium borate is present in an amount of from about 1 to about 25 weight %.

13. A method of making an imaged element comprising:
A) imagewise exposing the negative-working imageable element of claim 1 to form exposed and non-exposed regions, and
B) without a preheat step, developing said imagewise exposed element to remove only said non-exposed regions.

14. The method of claim 13 wherein said radiation absorbing compound is an IR-sensitive dye and said imagewise exposing step A is carried out using radiation having a maximum wavelength of from about 700 to about 1200 nm at an energy level of from about 20 to about 500 mJ/cm$^2$.

15. An imaged element obtained from the method of claim 13.

* * * * *